United States Patent [19]
Kasulke

[11] Patent Number: 6,119,919
[45] Date of Patent: Sep. 19, 2000

[54] METHOD AND DEVICE FOR REPAIRING DEFECTIVE SOLDERED JOINTS

[75] Inventor: Paul Kasulke, Berlin, Germany

[73] Assignee: Pac Tech - Packaging Technologies GmbH, Nauen, Germany

[21] Appl. No.: 09/445,729

[22] PCT Filed: Jun. 8, 1998

[86] PCT No.: PCT/DE98/01552

§ 371 Date: Dec. 9, 1999

§ 102(e) Date: Dec. 9, 1999

[87] PCT Pub. No.: WO98/57774

PCT Pub. Date: Dec. 23, 1998

[30] Foreign Application Priority Data

Jun. 13, 1997 [DE] Germany ............ 197 25 255

[51] Int. Cl.[7] .............. B23K 3/02; B23K 3/03; B23K 1/00; H05B 1/00; H05B 3/42
[52] U.S. Cl. ............... 228/119; 228/51; 228/19; 219/229; 219/231
[58] Field of Search ............... 228/119, 51, 19; 219/229, 231

[56] References Cited

U.S. PATENT DOCUMENTS

| 3,970,234 | 7/1976 | Litt et al. | 228/20 |
|---|---|---|---|
| 4,187,972 | 2/1980 | Vella | 228/20 |
| 4,412,641 | 11/1983 | Fuchs et al. | 228/37 |
| 4,773,582 | 9/1988 | Vella | 228/20 |
| 4,813,589 | 3/1989 | Palmer et al. | 228/119 |
| 5,031,817 | 7/1991 | Chen | 228/20 |
| 5,575,417 | 11/1996 | Allison et al. | 228/119 |
| 5,945,015 | 8/1999 | Feinler | 219/229 |

*Primary Examiner*—Patrick Ryan
*Assistant Examiner*—Colleen Cooke
*Attorney, Agent, or Firm*—McGlew and Tuttle, P.C.

[57] ABSTRACT

Method for repairing defective soldered joints, in which in a first method step a soldering material handling device is placed with a soldering material removal device at a soldering material defect point and a defective soldering material deposit is loosened from the connection with a soldering material carrier and removed, and in which in a second method step a soldering material unit from a soldering material application device of the soldering material handling device is applied to the soldering material carrier and connected to the soldering material carrier, the application device being placed at the soldering material defect point.

9 Claims, 3 Drawing Sheets

METHOD AND DEVICE FOR REPAIRING DEFECTIVE SOLDERED JOINTS

FIELD OF THE INVENTION

The present invention relates to a method for repairing defective soldered joints and an apparatus for repairing defective soldered joints with a soldering material handling device and a soldering material isolating device.

BACKGROUND OF THE INVENTION

In the industrial manufacture of components in microelectronics, such as for example wafers, multichip modules and also so-called, chip-size packages", these components are provided with soldering material deposits in preparation for a subsequent contacting with further components or mounting boards on a connection area distribution provided at their surface. In order to produce the soldering material deposits, apparatuses are used which apply isolated soldering material units to soldering material carriers formed by the individual connection areas of the connection area distribution and produce a connection of the soldering material units with the respective connection area.

Such an apparatus is known for example from DE 195 41 996, which shows a soldering material isolating device for producing isolated soldering material units with a soldering material application device for the application and connection of soldering material units with the connection areas.

Due to statistical irregularities in the process parameters and minute geometrical differences in the coordination between the soldering material application device and the soldering material carrier, or else because of the surface geometry of the soldering material carrier, there occur during the execution of such methods for producing soldering material deposits increasing numbers of defectively formed soldering material deposits. The range of the possible defects extends here from the complete absence of a soldering material deposit on a connection area to the formation of short-circuit between adjacent soldering material deposits. To date the occurrence of such defects in the production of soldering material deposits has been as a rule synonymous with the elimination of the corresponding components as rejects.

There is known from WO-A-97/12714 a method and an apparatus which can be used for repairing defective soldered joints, and in which, in addition to a handling device for the application of a component to a substrate, which is used simultaneously for the melting of a soldered joint, the use of further separate devices is recommended, in order to apply soldering material to the substrate for the contacting of the component or to remove it.

SUMMARY AND OBJECTS OF THE INVENTION

The present invention is therefore based on the object of proposing a method, or an apparatus suitable for the carrying out of such a method, which simplifies the repair of defective soldering material deposits.

In order to achieve this object, the method according to the invention comprises the features of claim 1.

With the method according to the invention for repairing defective soldered joints a soldering material handling device is in a first method step placed at a soldering material defect point together with a soldering material removing device and a defective soldering material deposit is loosened from the connection with a soldering material carrier and removed. In a second method step a soldering material unit is applied to the soldering material carrier with a soldering material application device of the soldering material handling device, said soldering material application device being placed at the soldering material defect point, and connected to the soldering material carrier.

According to the invention, in order to form the soldering material removal device and in order to form the soldering material application device, one and the same soldering material handling device is operated in two different types of function. The necessity, in order to carry out the method according to the invention, to provide the soldering material removal device and the soldering material application device as separate devices is thereby dispensed with. Both functions can instead be carried out by a single device.

In order to form the soldering material removal device the soldering material handling device can be operated first of all in a melting mode in order to loosen the connection of the soldering material deposit with the soldering material carrier and then in a handling mode in order to remove the soldering material deposit from the soldering material carrier.

In order to form the soldering material application device the soldering material handling device can be operated first of all in a handling mode in order to apply a soldering material unit to the soldering material carrier and then in a melting mode in order to connect the soldering material unit to the soldering material carrier.

It proves to be particularly advantageous if the loosening of the connection of the soldering material deposit with the soldering material carrier and the connecting of the soldering material unit to the soldering material carrier takes place by means of an exposure of the soldering material deposit or the soldering material unit to laser energy. A targeted introduction of the energy required for the melting without unnecessarily high heating of the areas surrounding the soldered joint is thereby possible.

According to a preferred variant of the method according to the invention the removal of the soldering material deposit from the soldering material carrier takes place by means of low pressure and the application of the soldering material unit to the soldering material carrier by means of excess pressure. It is thereby possible to use one and the same medium both for removing and for applying the soldering material. The use of a gas, in particular a protective gas, proves to be particularly advantageous in this connection.

A particularly suitable apparatus according to the invention for carrying out the method according to the invention exhibits the features of claim 4.

The apparatus according to the invention for repairing defective soldered joints incorporates a soldering material handling device and a soldering material isolating device, wherein the soldering material handling device comprises a soldering material removal device for loosening and removing a soldering material deposit from a connection with a soldering material carrier and a soldering material application device for applying and connecting a soldering material unit to the soldering material carrier.

The apparatus according to the invention consequently combines all the devices which are required both for removing defective soldering deposits and for applying soldering material units. The apparatus according to the invention can consequently replace in a particularly advantageous manner conventional soldering material application devices which are used to produce soldering material deposits on connection area distributions and be used in its role as a repair device only in cases of necessity. With the use of the apparatus according to the invention, therefore, the installation of a further apparatus is not necessary in the carrying out of a method for producing soldering material deposits, but instead one and the same apparatus can be used both for producing the soldering material deposits and for repairing defective soldering material deposits.

According to the invention both the soldering material removal device and the soldering material application device are formed by one and the same structural arrangement of functional parts of the soldering material handling device. The necessity of providing the soldering material removal device and the soldering material application device as individual devices formed separately from one another is thereby dispensed with. Instead the various functions of both devices are made possible by one and the same structural arrangement. An apparatus of this kind is consequently distinguished by a particularly small overall volume.

According to the invention the soldering material removal device and the soldering material application device comprise a melting device for loosening the connection of the soldering material deposit with the soldering material carrier or for producing the connection of the soldering material unit with the soldering material carrier. It further proves to be particularly advantageous to use a laser device to form the melting device, since the laser device permits a contact-free energy input into the soldering material deposit or the soldering material unit with simultaneous formation of an adequate gap between the laser device and the joint, so that this gap can be utilised for the intermediate arrangement of further functional parts.

It further proves to be particularly advantageous if the soldering material removal device and the soldering material application device comprise a capillary mouthpiece subjectable to a gas pressure for removing the soldering material deposit from the soldering material carrier or for applying the soldering material unit to the soldering material carrier. It is thereby possible to form the soldering material removal device and the soldering material application device with the use of the smallest amount of equipment possible. The advantage furthermore exists of accommodating such a capillary mouthpiece without any difficulty in the gap discussed above between the soldering material joint and the melting device constructed as a laser device.

The above-mentioned capillary mouthpiece subjectable to a gas pressure is by simple differentiation between an operation at reduced pressure and an operation at excess pressure switchable from a function as soldering material removal device to a function as soldering material application device and vice-versa. To this end the capillary mouthpiece can be exposed to reduced pressure for the removal of the soldering material deposit from the soldering material carrier and be subjected to excess pressure for the application of the soldering material unit to the soldering material carrier.

Preferred also is an embodiment in which the soldering material handling device is couplable module-wise with the soldering material isolating device. It is thereby possible, for example, to couple one and the same soldering material handling device with different soldering material isolating devices, depending on the desired form of the soldering material units for producing the soldering material deposits.

It is also preferred if the coupling of the soldering material handling device with the soldering material isolating device takes place via a coupling device arranged between the laser device and the capillary mouthpiece. Apart from a simplest possible execution of the coupling between the soldering material handling device and the soldering material isolating device, it is also possible to use the coupling device simultaneously as a supply device for the supplying of soldering material units out of the soldering material isolating device to the capillary mouthpiece.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
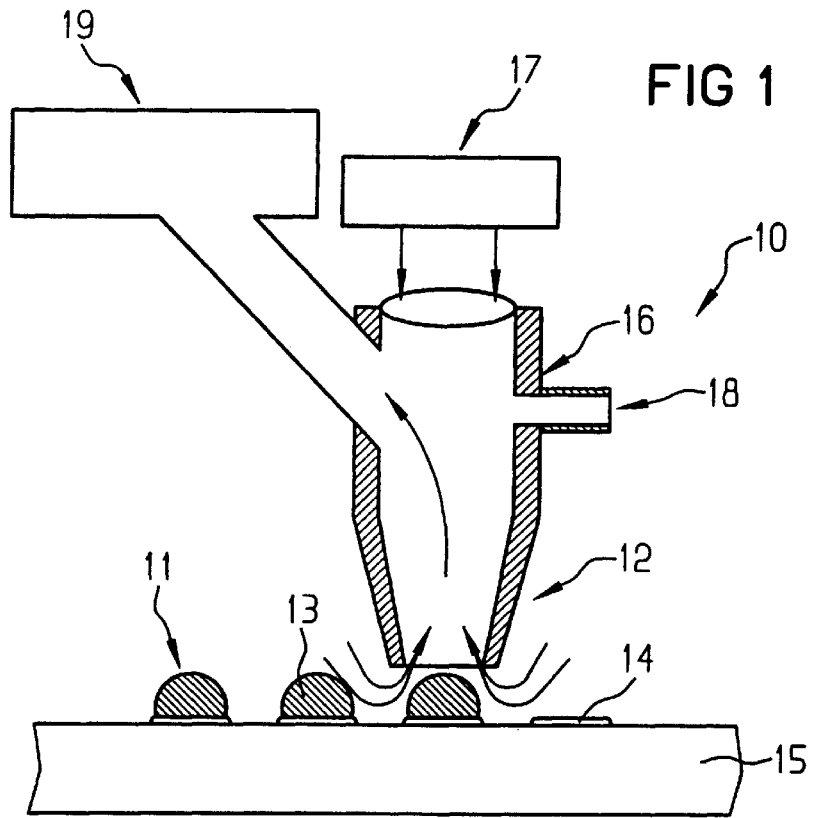
FIG. 1 is a sectional view showing the removal of a solder deposit arranged on a soldering material carrier by means of a soldering material handling device in the function as a soldering material removal device.

Referring to the drawings in particular, FIG. 1 shows in diagrammatic representation a repair apparatus 10 for repairing defective soldered joints 11 with a soldering material handling device 12 in the function shown here as a soldering material removal device in a first method step of the method explained below for repairing defective soldered joints 11.

In the first method step shown in FIG. 1 of the removing or detaching of soldering material deposits 13 from bumps 14 forming soldering material carriers, which bumps 14 are arranged in a connection area distribution (not shown in detail here) on the contact surface of an electronic component constructed here as a chip 15, first of all, as FIG. 1 shows, the soldering material handling device 12 is placed with its capillary mouthpiece 16 over the soldered joint 11. By means of a laser device 17 of the soldering material handling device 12 the soldered joint 11 is now exposed to laser energy in such a way that a melting of the soldering material deposit 13 arranged on the bump 14 takes place. Via a pressure connection 18 provided here on the capillary mouthpiece 16 of the soldering material handling device 12 there now takes place a subjecting to reduced pressure of the soldering material deposit 13. Due to the melting process the soldering material deposit 13 is now held only by the wetting forces formed between the liquid soldering material and the soldering material carrier and can be removed from the bump 14 by reduced pressure and transferred into a collection vessel 19 connected to the capillary mouthpiece 16.

Figure 2:
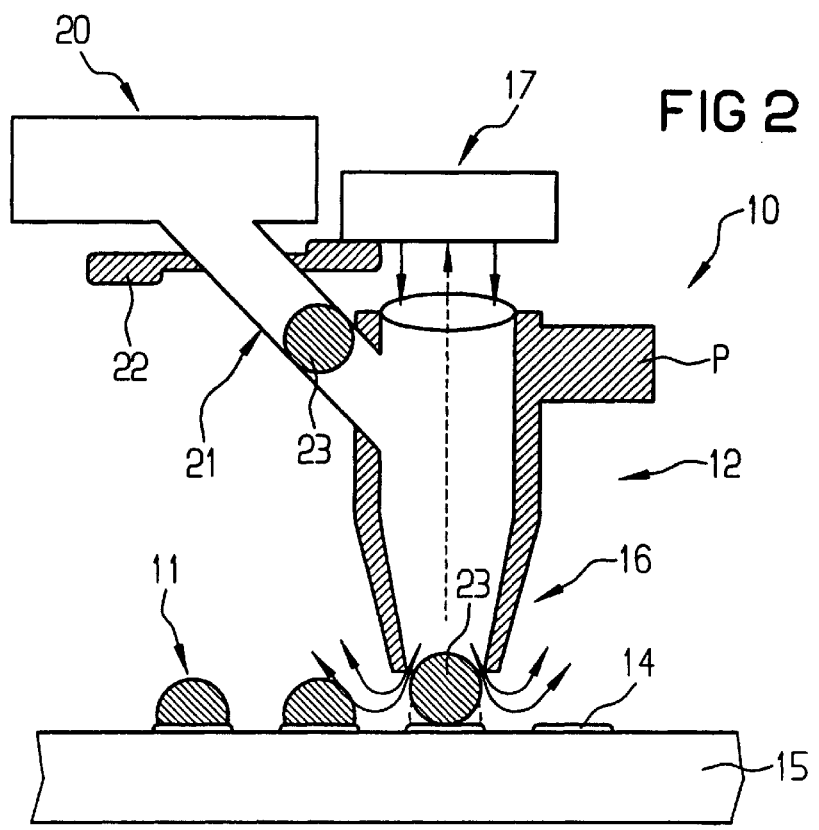
FIG. 2 is a sectional view showing the application of a soldering material unit by means of the soldering material handling device shown in FIG. 1 in the function as a soldering material application device.

FIG. 2 shows the soldering material handling device 12 in its function as a soldering material application device, wherein here the soldering material handling device 12 is used in a method step following the method step shown in FIG. 1 and therefore after the removal of the soldering material deposit 13 according to FIG. 1 it remains in the placing assigned to the soldered joint 11 concerned. The switching of the soldering material handling device 12 from the function as a soldering material removal device shown in FIG. 1 into the function as a soldering material application device shown in FIG. 2 takes place by simple switching over of the pressure connection 18 from a reduced pressure operation to an excess pressure operation. In addition the soldering material handling device 12 is now coupled in its function as a soldering material application device with a soldering material isolating device 20. For this, in the representation shown diagrammatically in FIG. 2, the capillary mouthpiece 16 is connected via a supply channel 21 to a transfer device 22 of the soldering material isolating device 20.

The application of a soldering material unit 23 out of the soldering material isolating device 20 takes place by transfer of the soldering material unit 23 through the supply channel 21 into the capillary mouthpiece 16 and subjecting of the soldering material unit 23 to excess pressure in order to produce a mechanical contact which is as gap-free as possible between the soldering material unit 23 and the bump 14. In this position there then takes place the exposure of the soldering material unit 23 to laser energy emitted by the laser device 17 for the making of a soldered connection and the production of a soldered joint II. Further, as shown in FIG. 2 by the arrow drawn as a dotted line, the activation of the laser device 17 can take place by means of a detector signal triggered, for example, by an optical sensor, which records the correct application of the soldering material unit 23 to the bump 14.

Figure 3:
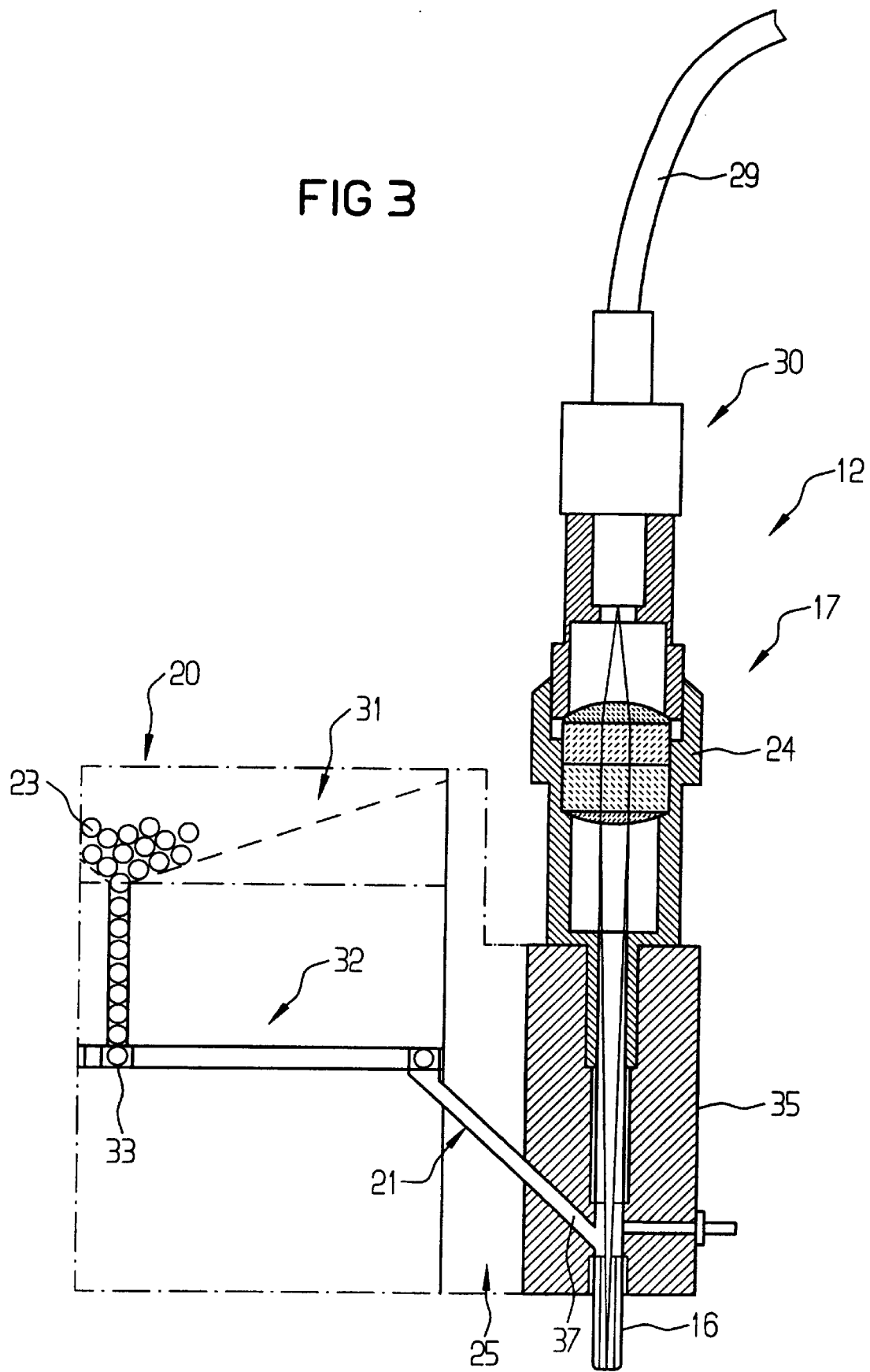
FIG. 3 is a sectional view showing a possibility for a structural embodiment of the soldering material handling device used in the method for repairing soldering material joints according to FIGS. 1 and 2.

Both the subjecting to reduced pressure of the soldered joint 11 taking place in the method step shown in FIG. 1 and the subjecting to excess pressure of the soldered joint 11 or the soldering material unit 23 taking place in the method step shown in FIG. 2 can take place by means of an inert gas—for example also with the use of nitrogen—and also during the exposure of the soldered joint 11 or the soldering material unit 23 to laser energy by the laser device 17, so that on the one hand the production of soldered joints which are free from oxidation residues to the greatest possible extent is possible and on the other hand an undesirable deposit due to vapour formation during the melting of the soldering material onto an optical arrangement 24, shown in FIG. 3, of the laser device 17 is prevented. The subjecting to gas of the soldering material deposits 13 or of the soldering material unit 23 for their transport within the capillary mouthpiece 16 can take place directly through the capillary mouthpiece 16. The subjecting of the soldered joint 11 or the optical arrangement 24 to gas for their shielding can take place via a ring nozzle (not shown in detail here) formed on the capillary mouthpiece 16.

FIG. 3 shows a possible embodiment of the repair apparatus 10 shown in various method steps in FIGS. 1 and 2. In the exemplifying embodiment shown in FIG. 3 the soldering material handling device 12 is coupled to the soldering material isolating device 20 by means of a coupling device 25. At the same time the coupling element 25 serves to connect the capillary mouthpiece 16 to the laser device 17, which comprises the optical arrangement 24 already mentioned above. The optical arrangement 24 comprises in the present case a lens system incorporating a collimator lens 26 and a collector lens 27, wherein the optical arrangement 24 is adjusted in such a way that, as indicated by a an optical path 28 along an optical axis 36 shown in FIG. 3, a focussing of the optical path 28 in the area of the joint (not shown in FIG. 3) takes place.

The connection to a laser source, arranged at a distance from the laser device 17, to the laser device 17 takes place here via a fibre glass conductor 29, which is connected to the laser device 17 via a plug connection 30.

In the exemplifying embodiment shown in FIG. 3 the soldering material isolating device 20 incorporates a storage vessel 31, in which are disposed lumpy soldering material units 23 which are received in conveying holes 33 via a circular conveyor 32 provided with a hole pitch circle and transferred individually as required to the supply channel 21 formed in the coupling device 25.

In the exemplifying embodiment shown in FIG. 3 the coupling device 25 is formed from a stationary connection part 34 connected to the soldering material isolating device 20 and a swivelling part 35 swivellably supported on the connection part 34, wherein the swivelling part 35 produces a rotationally rigid connection between the laser device 17 and the capillary mouthpiece 16. The arrangement shown in FIG. 3 makes it possible, by means of a modification of the swivel position of the swivelling part 35 compared with the connection part 34 by swivelling about a swivel axis substantially identical to the optical axis 36, to switch the soldering material handling device 12 from the swivel position shown in FIG. 3, in which the soldering material handling device 12 has the function of the soldering material application device, into a second swivel position shown in FIG. 4. In this second swivel position the swivelling part 35 is connected via a supply channel part 37 formed in the swivelling part 35 not to the supply channel 21 issuing into the soldering material isolating device 20, but rather to a supply channel 38 shown in FIG. 4, which issues into the collection vessel 19 via the connection part 34.

Figure 4:
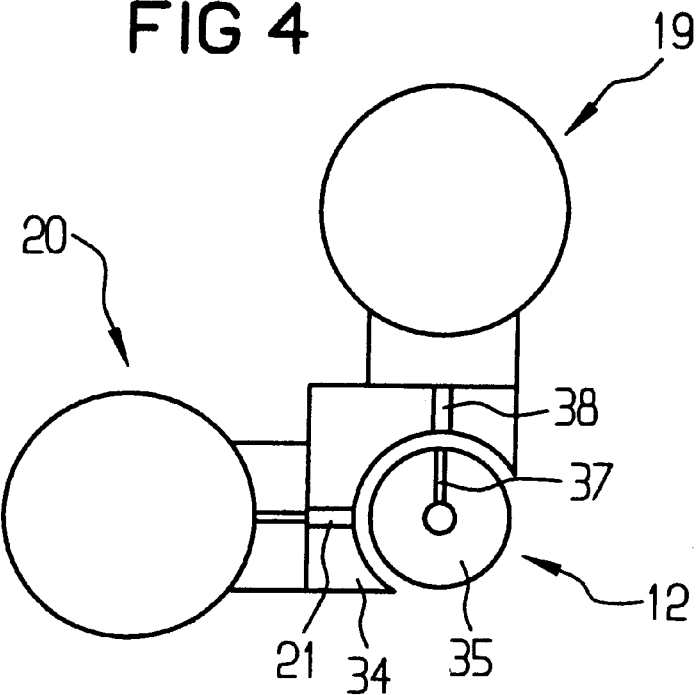
FIG. 4 is an overhead view of the soldering material handling device shown in FIG. 3.

Contrary to the representation in FIGS. 3 and 4 it is also possible to provide a soldering material handling device with respectively two mutually assigned capillary mouthpieces arranged on a common optical axis and optical arrangements, so that a first unit consisting of a first capillary mouthpiece and a first optical arrangement serves to form the soldering material removal device and a second unit consisting of a second capillary mouthpiece and a second optical arrangement serves to form the soldering material application device. Both the units can then by switching over of an optical path emitted from a laser source—for example by means of a swing-out mirror—be exposed to laser energy from a single laser source.

Figure 5:
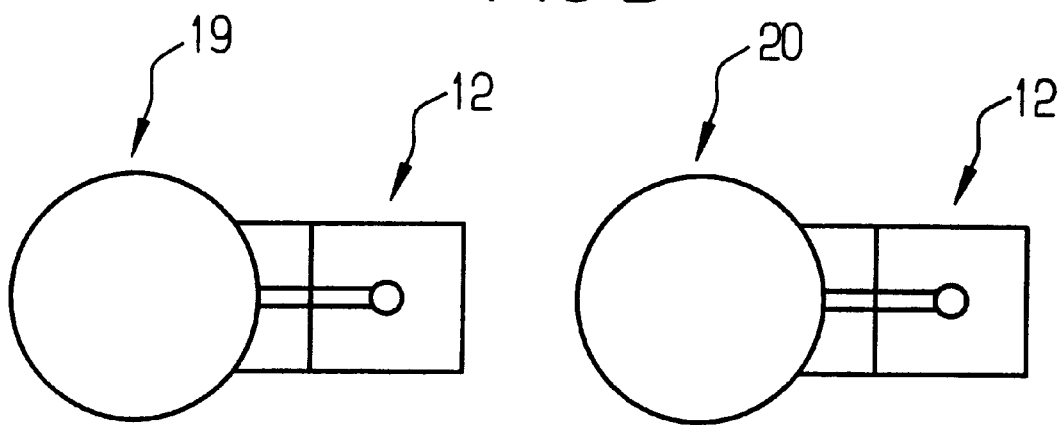
FIG. 5 overhead view of an alternative embodiment of an apparatus for repairing defective soldered points.

FIG. 5 shows, finally, an arrangement or construction of a repair apparatus 39, in which two soldering material handling devices 12 are provided which in one case is formed as a soldering material removal device connected to a collection vessel 19 and in the other case is formed as a soldering material application device connected to a soldering material isolating device 20 and can be used in parallel in the method explained above for repairing defective soldered joints.

While specific embodiments of the invention have been shown and described in detail to illustrate the application of the principles of the invention, it will be understood that the invention may be embodied otherwise without departing from such principles.

What is claimed is:

1. A method for repairing defective soldered joints, the method comprising the steps of:

placing a soldering material handling device at a soldering material defect point with a soldering material removal device;

loosening a defective soldering material deposit from the connection with a soldering material carrier and removing it;

applying a soldering material unit to the soldering material carrier and connected to the soldering material carrier out of a soldering material application device of the soldering material handling device, the soldering material application device being placed at the soldering material defect point;

operating one and the same soldering material handling device is in two different functional modes in order to form the soldering material removal device and in order to form the soldering material application device, in such a way that in order to form the soldering material removal device the soldering material handling device is first operated in a melting mode for loosening the connection of the soldering material deposit with the soldering material carrier and then in a handling mode for removing the soldering material deposit from the soldering material carrier, and in such a way that, in order to form the soldering material application device the soldering material handling device is operated first in a handling mode for applying a soldering material unit to the soldering material carrier and then in a melting mode for connecting the soldering material unit to the soldering material carrier.

2. The method according to claim 1, wherein the loosening of the connection of the soldering material deposit with the soldering material carrier and the connection of the soldering material unit to the soldering material carrier takes place by means of an exposure of the soldering material deposit or the soldering material unit to laser energy.

3. The method according to claim 1, wherein the removal of the soldering material deposit from the soldering material carrier takes places by means of reduced pressure and the application of the soldering material unit to the soldering material carrier by means of excess pressure.

4. An apparatus for repairing defective soldered joints, comprising:

a soldering material handling device with a soldering material removal device for loosening and removing a soldering material deposit from a connection with a soldering material carrier and a soldering material application device for applying and connecting a soldering material unit to said soldering material carrier, said soldering material removal device and said soldering material application device being formed by one and the same structural arrangement of functional parts of said soldering material handling device, wherein said soldering material removal device and said soldering material application device comprise a melting device for loosening a connection of a soldering material deposit with the soldering material carrier or for producing a connection of said soldering material unit with said soldering material carrier; and a soldering material isolating device.

5. An apparatus according to claim 4, wherein said melting device is formed by a laser device.

6. The apparatus according to claim 4, wherein said soldering material removal device and the soldering material application device comprise a capillary mouthpiece subjectable to a gas pressure for removing the soldering material deposit (13) from the soldering material carrier or for applying the soldering material unit to the soldering material carrier.

7. The apparatus according to claim 6, wherein the capillary mouthpiece is subjectable to reduced pressure for removing the soldering material deposit from the soldering material carrier and to excess pressure for applying the soldering material unit to the soldering material carrier.

8. The apparatus according to claim 4 wherein said soldering material handling de vice is couplable modulewise with the soldering material isolating device.

9. The apparatus according to claim 8, wherein the coupling of the soldering material handling device with the soldering material isolating device takes place via a coupling device arranged between the laser device and the capillary mouthpiece.

* * * * *